United States Patent
Boeve et al.

(10) Patent No.: US 8,237,436 B2
(45) Date of Patent: Aug. 7, 2012

(54) MR MAGNETOMETER WITH COMBINED FLIP COIL AND COMPENSATION COIL

(75) Inventors: Hans M. B. Boeve, Hechtel-Eksel (BE); Teunis J. Ikkink, Geldrop (NL); Haris Duric, Helmond (NL); Johannes P. M. Van Lammeren, Beuingen (NL)

(73) Assignee: NXP B.V., Eindhoven (NL)

( * ) Notice: Subject to any disclaimer, the term of this patent is extended or adjusted under 35 U.S.C. 154(b) by 536 days.

(21) Appl. No.: 12/526,719

(22) PCT Filed: Feb. 13, 2008

(86) PCT No.: PCT/IB2008/050517
§ 371 (c)(1),
(2), (4) Date: Aug. 11, 2009

(87) PCT Pub. No.: WO2008/099350
PCT Pub. Date: Aug. 21, 2008

(65) Prior Publication Data
US 2010/0013471 A1  Jan. 21, 2010

(30) Foreign Application Priority Data
Feb. 14, 2007 (EP) ................................. 07003104

(51) Int. Cl.
*G01R 33/02* (2006.01)
(52) U.S. Cl. ...................... 324/252; 338/32 R
(58) Field of Classification Search .................. 324/252; 338/32 R
See application file for complete search history.

(56) References Cited

U.S. PATENT DOCUMENTS

| 5,519,318 A | 5/1996 | Koerner et al. |
| 2006/0087318 A1 | 4/2006 | Crolly et al. |

FOREIGN PATENT DOCUMENTS

| DE | 19740408 A1 | 3/1998 |
| DE | 196 48 879 A1 | 6/1998 |
| DE | 19834153 A1 | 2/2000 |
| DE | 10 2004 056384 A1 | 2/2006 |
| DE | 10 2005 039280 A1 | 2/2007 |
| WO | 9909427 A1 | 2/1999 |

OTHER PUBLICATIONS

Stork, Thomas; "Philips Semiconductors—Application Note AN 00022—Electronic Compass Design Using KMZ51 and KMZ52"; Mar. 30, 2000; pp. 1-38.

Hauser, H., et al., "Anistropic Magnetoresistance Effect Field Sensors"; Journal of Magnetism and Magnetic Materials; Elsevier Science Publishers, Amsterdam, NL; vol. 215-216, Jun. 1, 2001; pp. 788-791.

Mlejnek, et al.; "AMR Current Measurement Device"; Sensors and Actuators A; Elsevier Sequoia S.A., Lausanne, CH; vol. 141, No. 2; Oct. 16, 2007; pp. 649-653.

*Primary Examiner* — Reena Aurora

(57) ABSTRACT

Compensation coil functionality and flip coil functionality are combined into a single combination coil that is placed under an angle $\alpha$ with respect to the length direction of a magneto-resistive sensor element. The angle $\alpha$ substantially deviates from 0° and 90°. This configuration enables to reduce the width of the current line of the planar combination coil, to reduce the effective threshold for sensor element switching, and to include features to simplify a 2D sensor design.

10 Claims, 4 Drawing Sheets

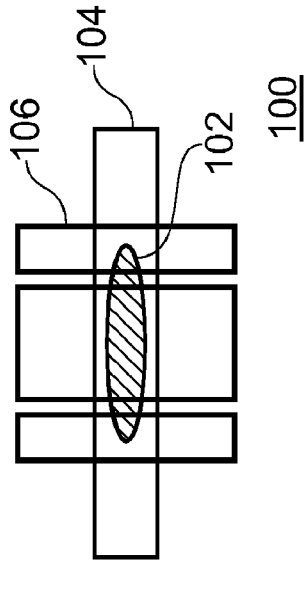

FIG. 1A (PRIOR ART)

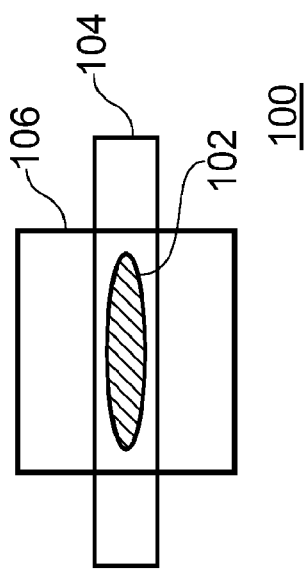

FIG. 1B (PRIOR ART)

$$H = \frac{I}{2\pi wh}\left[2(d+h)\arctan\left(\frac{w'}{2(d+h)}\right) - 2d\arctan\left(\frac{w'}{2d}\right)\right] + \frac{I}{2\pi wh}\left[\frac{w}{2}\ln\left((d+h)^2 + \left(\frac{w'}{2}\right)^2\right) - \frac{w}{2}\ln\left(d^2 + \left(\frac{w'}{2}\right)^2\right)\right]$$

LEGEND
I = current through current conductor
d = distance from conductor location where H is measured
w = width of current conductor
h = thickness of current conductor

FIG. 2

$$d_{Comp} = \frac{1}{2} t_{AMR} + t_{BP} + t_{Pass1}$$
$$d_{Flip} = d_{Comp} + t_{Comp} + t_{Pass2}$$

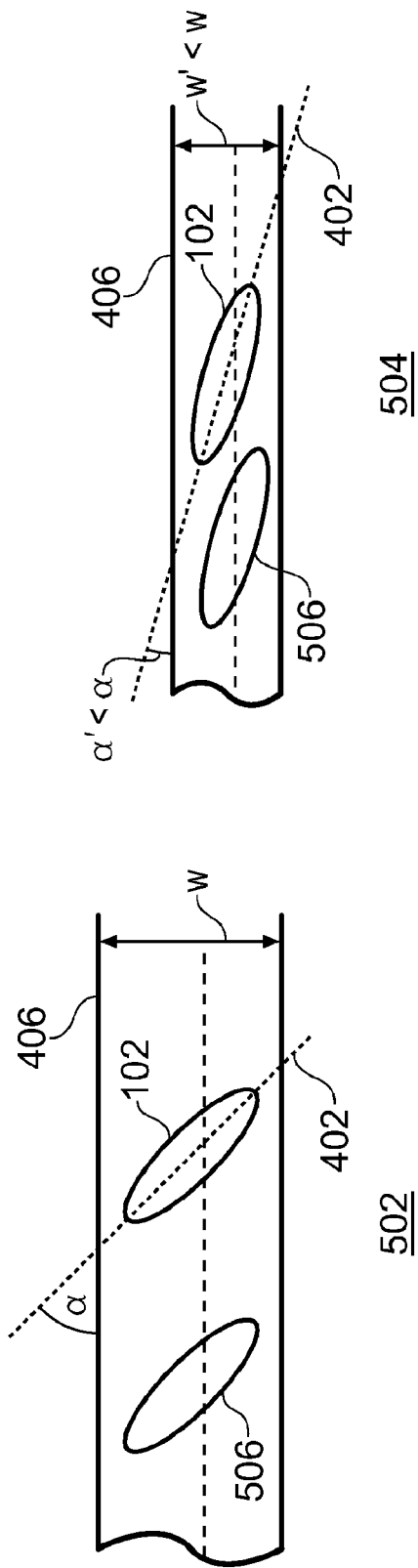

MR MAGNETOMETER WITH COMBINED FLIP COIL AND COMPENSATION COIL

FIELD OF THE INVENTION

The invention relates to an electronic device with an MR magnetometer that has a flip coil functionality and a compensation coil functionality.

BACKGROUND ART

Magneto-resistance (MR) is a material property of a whole family of ferromagnetic alloys that refers to a dependence of electrical resistance on the angle between the direction of the electrical current flowing through the material and the orientation of an external magnetic field relative to the direction of the current. The effect is attributed to a larger probability of s-d scattering of electrons in the direction of the magnetic field. The net effect is that the electrical resistance maximum value when the direction of current is parallel to the applied magnetic field. An example of such material is a ferromagnetic material called "permalloy" (19% Fe, 81% Ni).

MR materials can be used to create magnetic field sensors, also referred to as magneto-meters. Operation and examples of such sensors are described in Application Note AN 00022 "Electronic Compass Design using KMZ51 and KMZ52", author Thomas Stork, of Philips Semiconductors, dated Mar. 30, 2000. The KMZ52 is a commercially available electronic device manufactured by Philips that comprises the components of a compass sensor system within one package: two weak-field sensors with 90° displacement, each having a set/reset (flip) coil and a compensation coil. Typical current levels are 10 mA for the compensation coil and 1 A for the flip coil. About 2 mA is sufficient to balance the earth magnetic field. Therefore, the resistance of the flip coil is preferably relatively low, e.g., in the order of a few Ohms. Such sensors are manufactured using e.g., a thin-film technology or an integrated circuit technology.

Magnetic field sensors can be used in e.g., solid state compassing, metal detection, position detection, etc.

First, consider a sensor made of a simple strip of MR material. During fabrication, a strong external magnetic field is applied parallel to the strip's main axis. As a result, a preferred magnetization direction is defined in the strip. In the absence of a magnetic field, the magnetization always points into that direction. The operation of the sensor relies on two effects. The first effect is that the resistance of the strip depends on the angle between a direction of the current flowing through the strip and the direction of the magnetization. The second effect is that the direction of the magnetization, and therefore of the angle, can be influenced by an external magnetic field parallel to the strip and perpendicular to the preferred direction.

The simple strip sensor has a low sensitivity for small magnitudes of the external magnetic field. In addition, the simple sensor cannot discriminate between external magnetic fields of the same magnitude but with opposite directions. Therefore, the sensor has preferably a so-called "barber-pole" configuration. This is achieved by depositing e.g., aluminum stripes (called "barber poles") on top of the MR strip at an angle of 45° to a main axis of the strip. As aluminum has in general a much higher conductivity than MR material, the effect of the barber pole is to rotate the current direction by 45°, effectively changing the angle between the magnetization of the MR material and the electrical current from an angle of magnitude "α" to an angle of magnitude "α−45°". For weak magnetic fields such as the earth's field, the sensitivity now is significantly higher. In addition, the characteristic is linearized and allows detecting the sign of the external magnetic field.

In practice, it is advantageous to configure the sensor as a Wheatstone bridge, consisting of four magneto-resistive strips. For e.g., compass sensors, the barber pole structures are used, where one diagonal pair is orientated at +45° to the strip's main axis, and the other pair is orientated at −45°. Thus, the resistance variation due to a magnetic field is converted linearly into a variation of the differential output voltage. Moreover, the inherent temperature coefficients of the four bridge resistances are mutually compensated.

MR sensors are bi-stable by nature. That is, the direction of their internal magnetization can be inverted or "flipped". This can be achieved by a magnetic field of sufficient strength, if that field is applied parallel to the magnetization, but having opposite direction. Flipping causes an inversion of the sensor characteristic, such that the sensor output voltage changes polarity. MR sensors can be stabilized against unwanted flipping by applying an auxiliary magnetic field parallel to the flipping axis. This auxiliary field should be pulsed, as a permanent field would decrease the sensitivity of the magnetometer. When measuring weak fields, it is even desired to invert or "flip" the sensor characteristic repetitively between consecutive magnetometer readings. This allows compensating the sensor's offset drift in a way comparable to the chopping technique used in the amplification of small electrical signals. A "set/reset" coil also referred to as "flip" coil, near the sensor element is a means to apply the auxiliary field for the flipping. In e.g., high-precision compass systems, the sensor must also allow to compensate for sensitivity drift with temperature and to compensate for interference fields. Both can be done by means of an auxiliary field in the field-sensitive direction that is perpendicular to the MR strips. This can be generated by a "compensation" coil near the sensor element.

An example of an electronic device with MR sensor strip electronic device with an MR sensor that comprises an MR sensor strip, a flip coil functionality and a compensation coil functionality is known from WO 99/09427. The known device has sensor strips all oriented in the same direction, and included in a Wheatstone bridge. The set-reset coil, or flip coil, is oriented perpendicular to the strip direction and compensation coils are oriented in the direction of the strips.

Another example is known from DE 196 48 879. In the known device, the flip coil consists of a combination of different current lines over a sensor strip. The current density on the outer current lines is higher than in the inner lines. This allows lowering of the switching threshold of the magnetic sensor strip.

SUMMARY OF THE INVENTION

In a first order approximation, the magnetic field that is generated by a line current decreases inversely proportionally with the distance from the line. Power optimization indicates that the distance between the sensor and the compensation coil, and the distance between the sensor and the flip coil should be as small as possible. In other words, the basic problem is that ideally both coils should be located as close as possible to the MR sensor. Given the large difference in current that needs to flow through the flip coil and the compensation coil, one usually positions the flip coil on top of the compensation coil that in turn is located on top of the MR sensor. The process starts with preparing the MR sensor because a uniform substrate is required for good sensor performance.

Functional MR sensors without compensation coil are possible, although compensating through auxiliary fields is no longer an option. Another disadvantage of this approach is the fact that the sensitivity of the sensor can no longer be measured by electrical means. That is, if the MR sensor does have a compensation coil, a current of known magnitude is sent through the compensation coil, and the response of the MR sensor is monitored and analyzed for sensitivity. In other words, if the MR sensor does not have a compensation coil, testing in an external magnetic field of known magnitude may be required. Additionally, implementing a standard self-test in an MR sensor (e.g., as a customer requirement) becomes cumbersome without the presence of a compensation coil.

The inventors now propose to combine both the flip coil functionality and the compensation coil functionality into a single physical element, e.g., a combination coil or a plurality of line segments of electrically conductive material. More specifically, the invention provides an electronic device with a magnetometer that has an MR sensor that comprises at least one MR sensor strip, a flip coil functionality and a compensation coil functionality. The flip coil functionality and the compensation coil functionality have been implemented in a single physical element. The element has a first main axis positioned at an angle with respect to a second main axis of the MR sensor strip. The angle is substantially different from 0° and from 90°. A current in the element creates a local effective magnetic field in the sensor strip. The field component along the strip results in a magnetic field that can be used to flip the direction of the magnetization of the sensor strip. The component perpendicular to the strip acts as a compensation field. Furthermore, the width of the current lines of a planar coil can be reduced, so that the effective threshold can be reduced for sensor element switching, and features can be included to simplify a 2D sensor design. The invention also leads to a cost saving, as only a single metal level is required for the flip coil functionality and the compensation coil functionality. At least two mask levels can be saved this way. Overall sensor performance as known from prior art devices can be maintained. All aspects described in the different embodiments further below can be combined to create the optimal solution, e.g., trading off power consumption against overall size of the device. In addition, given the fact that an assisting perpendicular field can be present during magnetization reversal when flipping, the effective magnetic field strength that is required for flipping can be reduced. This can be understood using a simple Stoner-Wohlfarth approach for magnetic materials having a uni-axial anisotropy. The magnetization preferably lies along the direction of the flip field. This direction is mainly determined by the shape of the MR material in the direction of its main axis. As soon as a total magnetic field can be created, which includes the combined effect of the flip field and the compensation field and whose strength exceeds the Stoner-Wohlfarth criterion for switching, i.e., as soon as it lies outside the well-known asteroid curve that represents the switching characteristic of the magnetic element in two magnetic field dimensions, the magnetization can be flipped, provided that the field points in a direction opposite to the magnetization direction. The assisting compensation field is capable of rotating the magnetization of the MR material out of its flip field direction, so that the necessary strength of the flip field can be reduced.

In a device of the invention, a flip pulse or a compensation pulse may need to be of larger magnitude than the pulses used in the known configuration with separate coils due to the inherent projection of the magnetic field onto the first or second main axis of the MR sensor strip.

An embodiment especially interesting to mobile applications of the invention is the one wherein the angle between the first main axis of the element and the second main axis of the MR sensor strip is substantially larger than 45° and smaller than 90°. For example, the angle has a value in the range of about 75° to 85°. A reason for this specific configuration has to do with power consumption. The flip coil functionality is being used more frequently than the compensation coil functionality, so that a more obtuse angle improves the efficiency of the magnetometer as a whole. As a result, the power consumption is then reduced with respect to configurations with an acute angle. This is in particular relevant to applications such as magnetometers in mobile devices such as personal digital assistants and mobile telephones. The optimum angle depends on the application of the magnetometer. In practice, however, the design rules for solid state implementations of the magnetometer will also need to be considered.

BRIEF DESCRIPTION OF THE DRAWING

The invention is explained in further detail, by way of example and with reference to the accompanying drawing, wherein:

FIG. 1 is a diagram of the configuration of a known sensor device;

FIGS. 2 and 3 give a mathematical formulae used in the detailed explanation of the invention;

FIGS. 4 and 5 are diagrams of embodiment of the invention;

FIG. 6 gives a table with the magnitude of various physical quantities associated with different orientations between sensor strip and coil.

Throughout the Figures, similar or corresponding features are indicated by same reference numerals.

DETAILED EMBODIMENTS

Figures 3, 4:
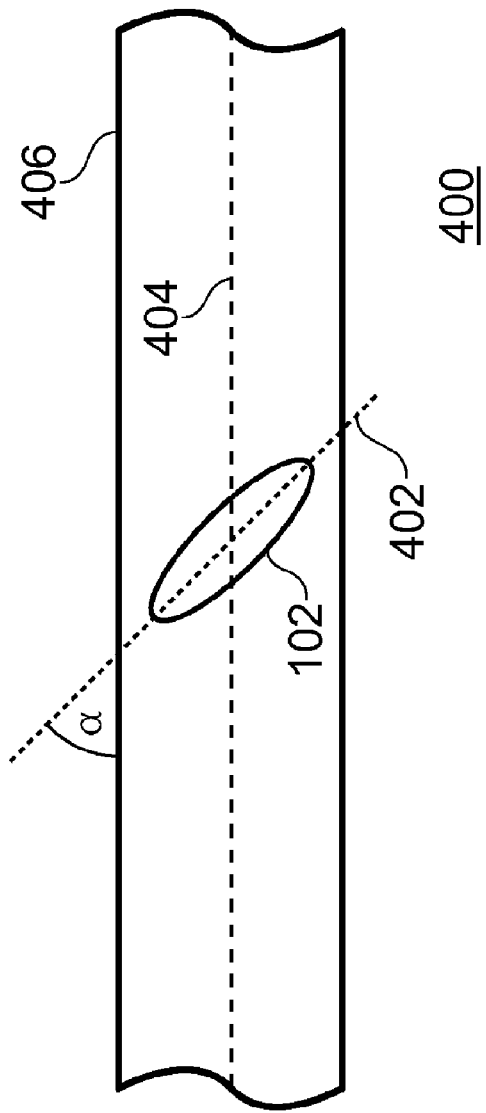

The invention relates to an electronic device with an MR sensor, and in particular to low-power and/or low-cost configurations. Low-power MR sensors are particularly interesting for mobile electronic devices such as mobile telephones, watches, palmtop computers or personal digital assistants, etc. For example, MR sensors can be used to implement an electronic compass that provides a navigational reference with respect to the earth's magnetic field.

FIG. 1 is a diagram to illustrate configurations of a known sensor 100. Sensor 100 is fabricated starting from an insulating silicon substrate. The order of processing is as follows, typical thickness per layer being indicated in nanometers. A first layer is the MR sensor definition layer with thickness "$t_{MR}$" of approximately 30 nm. A second layer relates to the sensor strip 102 of the barber pole type that requires a thickness "$t_{BP}$" of about 300 nm. A third layer is a first passivation layer with a thickness "$t_{Pass1}$" of about 500 nm. A fourth layer relates to the compensation coil 104 and has a thickness "$t_{Comp}$" of about 500 nm. A fifth layer is a second passivation layer with a thickness "$t_{Pass2}$" of about 1000 nm. A sixth layer relates to the flip coil definition 106 and has a thickness "$t_{Flip}$" of about 1000 nm.

FIG. 1 shows two different known flip coil configurations. Configuration A has a single conductor segment 106. Configuration B has a multi-conductor segment 106, wherein the current density in the outer segments can be increased in order to facilitate the switching in sensor strip 102. This latter configuration results in a lower switching threshold of the magnetic field, and therefore in a lower power consumption. On the downside, configuration B needs a more complex layout and interconnect pattern.

Based on above layer thicknesses one can now calculate the approximate magnetic field strength "H" within a sensor that comprises a 10 μm wide compensation coil and a 100 μm wide flip coil, for configuration A of FIG. 1. The mathematical expression for H is given in FIG. 2. The relevant distances "$d_{comp}$" for the compensation coil and "$d_{flip}$" for the flip coil are given in the expressions of FIG. 3. The field generating efficiency of the coils is defined as the magnitude of the generated magnetic field in Amperes per meter per amount of current in Amperes. A mathematical formula for this efficiency is given by the expression between square brackets in the formula for the magnetic field strength of FIG. 2, for a current I of 1 mA. The efficiency $G_{Comp}$ of the compensation coil in the known configuration of FIG. 1 is now 43.3 A/m per mA. The efficiency $G_{Flip}$ of the flip coil in the known configuration is 4.82 A/m per mA.

First imagine a flip coil that is positioned in the same layer as the compensation coil. As a result the efficiency of the flip coil increases to the same level as that of a compensation coil owing to its smaller distance: $G_{Flip,\perp}$ equals $G_{Comp\perp}$ and is about 4.91 A/m per mA within the MR sensor in a direction perpendicular to the conductor. It has been assumed that the dimensions of the conductor in both cases have remained the same as for the flip coil described with reference to the known configuration above. The symbol "$\perp$" in $G_{Flip,\perp}$ and $G_{Comp\perp}$ refers to the optimum 90° angular configuration between the coil layout and the corresponding main axis of the MR sensor strip.

Next consider an electronic device with an MR sensor that comprises an MR sensor strip (102), and a single physical element that implements both the flip coil functionality and the compensation coil functionality, wherein the main axis of the element is positioned at an angle α with respect to the main axis of the MR sensor strip. The angle is substantially different from 0° and from 90°. The single element can be a planar coil or a single straight conductor or multiple (geometrically) parallel straight conductors and interconnected to form a planar coil.

In a first embodiment of the invention the angle α between the main axis of the element and the main axis of the sensor is about 45°. Then, efficiency numbers for the optimal case wherein α is 90° (previously denoted by the symbol "$\perp$"), should be multiplied by geometrical factors cos (45°)=1/√2 and sin (45°)=1/√2, for compensation and flip operations, respectively. As a result the efficiency $G_{Comp}$ equals the efficiency $G_{Flip}$ and amounts to 3.48 A/m per mA.

For the compensation functionality, current pulses are used with small amplitude and of long duration, during which at least one magnetometer reading can take place. The amplitude is in the order of the strength of the earth-magnetic field (approx. 50 micro-Tesla), or lower. The pulse duration is in the millisecond range, or longer, in order to allow for a stable magnetometer reading.

For the flip functionality, current pulses are used with high amplitude and of short duration. As discussed before, this is to take place between consecutive magnetometer readings. The amplitude is to overcome the switching field of a typical MR element, typically one or two orders of magnitude larger than the earth-magnetic field. The pulse duration is in the microsecond range, or below. The polarity of the consecutive current pulses in the flip functionality is usually implemented as being alternating. This is also reflected by the expression "set-reset pulses". In the drive circuit design, one can then opt to measure either on only a single MR sensor characteristic, or on both stable characteristics (i.e., the non-inverted and inverted MR sensor characteristic).

The spatial configuration of first embodiment 400 is shown in the diagram of FIG. 4, wherein a main axis 402 of a sensor strip 102 makes an angle α of 45° with a main axis 404 of element 406 that combines the compensation coil functionality and the flip coil functionality. Element 406 represents a conductor, shown by two parallel lines, that is part of a planar coil.

In a second embodiment of the invention, the angle α can be given another value so that the configuration is optimized for low power consumption. Power consumption to be considered in this respect is related to the power dissipated during compensation operation and flip operation. Consider an angle α that is larger than 45°. For example, angle α is 75°. As a result the efficiency $G_{Comp}$ of the compensation coil functionality is 1.27 A/m per mA, and the efficiency $G_{Flip}$ of the flip coil functionality is 4.75 A/m per mA. The ratio in efficiency for flip functionality and compensation functionality in this case is about a factor 4.

In power-optimized designs it is anticipated that this ratio will be in the order of 2 to 10. It is to be noted that the compensation operation occurs seldom, e.g. during the manufacturing final test and the sensor self-test. Therefore, the efficiency of the compensation operation need not be high at all. Moreover, the main aim of the compensation operation is to measure the sensitivity of the sensor and, based on the sensitivity magnitude, to decide for flip operation and yield a live/dead indication for the magnetometer (e.g., during production or self-test). The sensitivity of a magnetometer can be deduced from at least one additional reading in a known magnetic field during compensation operation that is not zero (reference point). The slope can be estimated from the ratio of the delta in the output voltage of the sensor and the delta in the applied compensation field, and compared to a known value or range of values for a 'good' magnetometer. This method deviates from prior art since the total magnetic field vector in a compensation operation is no longer perpendicular to the sensor strip. For a known angle α, a parallel field component in the order of the earth magnetic field, or below, can be taken into account in a sensitivity assessment. Compared to the anisotropy field of the sensor strip, a deviation in the order of percents is to be expected.

Furthermore, the effective magnetic field in a compensation generation that must be generated can be substantially smaller than in nulling mode (standard in automotive applications). In the nulling mode the (total) magnetic field in an MR sensor element is kept zero in a feedback loop, in which a local magnetic field with a same magnitude but opposite sign is added to the magnetic field that is being measured. In a compass application, the projection of the external earth-magnetic field on the magnetometer axis would be compensated continuously. Hence the maximum field to be compensated has the magnitude of the external magnetic field in normal conditions.

An efficiency as low as 1 A/m per mA may be sufficient for a design according to the invention. Given the strong reduction in overall coil resistance that can be expected, due to the increased width of the conductor strips in this new coil design as compared to known coil designs, supplying a current in the 10 mA range during self-test may be realistic. As a result, one can easily generate fields in the range of 10% to 50% of the earth magnetic field. In this example, the flip operation will be similar to that of the first embodiment, since flip efficiency and wire resistance are of the same order of magnitude.

In a third embodiment of the invention, the width of current line 406 is reduced. The result is an increase in the field generating efficiency. Power efficiency in terms of $V \cdot I = R^2 \cdot I$ will scale accordingly, V being the voltage drop in Volts over the current line supplying the current I in Amperes and having a resistance of R in Ohms. FIG. 5 gives two examples 502 and 504 of the spatial configuration, each with a different width. In example 502, two sensor strips 102 and 506 lie below current conductor 406, the width w being determined by angle α. Example 504 has a smaller angle α' so that width w' can be smaller than width w.

FIG. 6 gives a table of the efficiency values as a result of scaling with a factor sin(α) in width, which translates into an inversely proportional increase of current generation efficiency with respect to that of the known device of FIG. 1.

Figure 7:
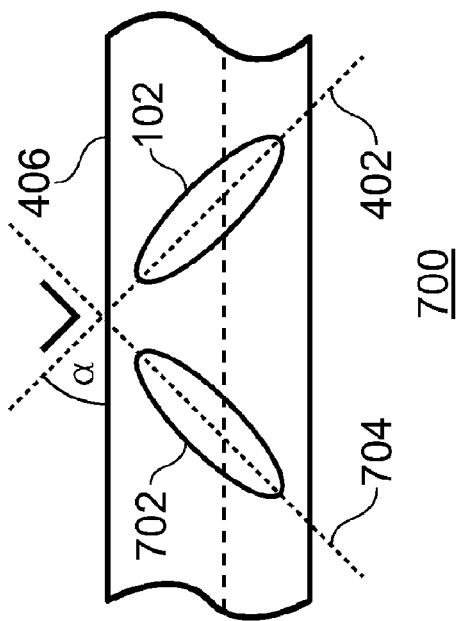
FIGS. 7 and 8 are diagrams of other embodiments in the invention.

FIG. 7 is a diagram illustrating a fourth embodiment 700 of the invention. In the case that the angle α is chosen to be 45°, magnetic sensors 102 and 702 with different orientations 402 and 704 can be combined under the same current line of the combined flip and compensation element 406, here a planar coil, without a need for the current line to deviate from a straight line. This can be an attractive feature for the layout of a single-die 2D magnetometer sensor.

Figure 8:
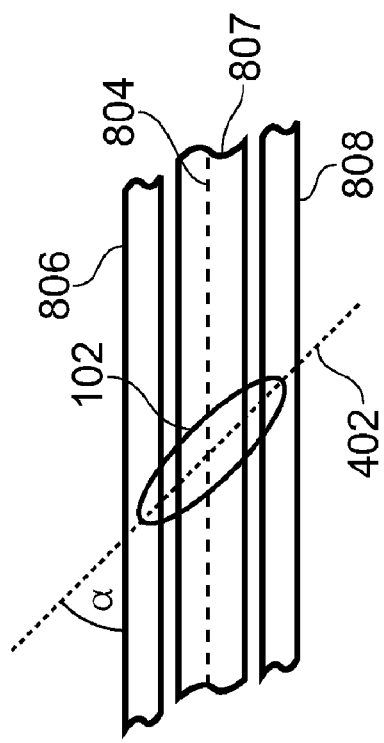

FIG. 8 is a diagram of a fifth embodiment 800 of the invention. The flip functionality and compensation functionality are provided by a plurality of straight line segments 806-807-808 of electrically conductive material that are positioned over sensor strip 102. In analogy with previous embodiments, the prior art multi-segment flip coil design 106 from FIG. 1B can be turned into a combination coil having compensation coil functionality and flip coil functionality by introducing an angle α between the main axis of the element 804 and the main axis of the sensor 102, leading to an interesting combination of very low power consumption and electrical testability (self-test) of a compact magnetometer.

The invention claimed is:

1. An electronic device having a magnetometer with a Magneto-Resistant (MR) sensor that comprises an MR sensor strip, a flip coil functionality and a compensation coil functionality, characterized in that:
   the flip coil functionality and the compensation coil functionality have been implemented in a single physical element;
   the element has a first main axis positioned at an angle with respect to a second main axis of the MR sensor strip; and
   the angle is substantially different from 0° and from 90°.

2. The device of claim 1, wherein the single physical element comprises a straight line segment made of electrically conductive material.

3. The device of claim 1, wherein the single physical element forms a coil of electrically conductive material fabricated in a single metal layer.

4. The device of claim 1, wherein the angle is about 45°.

5. The device of claim 1, wherein the angle is substantially larger than 45° and smaller than 90°.

6. The device of claim 1, comprising a further sensor strip having a further main axis that intersects the second main axis.

7. The device of claim 6, wherein the angle is about 45° and wherein the further main axis intersects the second main axis at about 90°.

8. The device of claim 1, with a solid-state compass comprising the magnetometer.

9. The device of claim 1, being a mobile data processing device.

10. The device of claim 9, being a mobile telephone.

* * * * *